United States Patent
Park et al.

(10) Patent No.: US 6,387,573 B1
(45) Date of Patent: May 14, 2002

(54) PHASE SHIFT MASK USING CRAION AS PHASE SHIFTER MATERIAL AND MANUFACTURING METHOD THEREOF

(75) Inventors: Jo-Hyun Park, Seoul; Eun-ah Kim; Kwang-soo No, both of Taejeon, all of (KR)

(73) Assignee: Samsung Electronics Co., Ltd., Suwon (KR)

(*) Notice: Subject to any disclaimer, the term of this patent is extended or adjusted under 35 U.S.C. 154(b) by 73 days.

(21) Appl. No.: 09/618,700

(22) Filed: Jul. 18, 2000

(30) Foreign Application Priority Data

Sep. 18, 1999 (KR) .......................................... 99-40288

(51) Int. Cl.[7] ................................................ G03F 9/00
(52) U.S. Cl. ...................................................... 430/5
(58) Field of Search ............................ 430/5, 322, 323, 430/324; 250/492.22

(56) References Cited

U.S. PATENT DOCUMENTS 5,536,604 A  7/1996 Ito
5,811,208 A  * 9/1998 Yokoyama et al. ............ 430/5

FOREIGN PATENT DOCUMENTS

KR     0130740    11/1997
KR      027558     7/1998

* cited by examiner

*Primary Examiner*—S. Rosasco
(74) *Attorney, Agent, or Firm*—F. Chau & Associates, LLP

(57) ABSTRACT

A phase shift mask formed by depositing on a transparent substrate a phase shifter material containing chromium (Cr), aluminum (Al), oxygen (O) and nitrogen (N). The transmissivity of a phase shifting layer of the phase shift mask, which is a CrAION layer, is increases, and the phase of exposure light is shifted by 180° at a predetermined thickness, so that a fine photoresist pattern can be formed. Also, the transmissivity of the phase shifting layer with respect to inspection light, which has a longer wavelength than exposure light, is relatively low, which permits accurate inspection of the mask. The phase shift mask can be useful in photolithography using a short wavelength of exposure light, and in an inspection apparatus using an inspection light source having a longer wavelength than exposure light.

22 Claims, 6 Drawing Sheets

PHASE SHIFT MASK USING CRAION AS PHASE SHIFTER MATERIAL AND MANUFACTURING METHOD THEREOF

BACKGROUND OF THE INVENTION

1. Field of the Invention

The present invention relates to a phase shift mask and a method of manufacturing the same.

2. Description of the Related Art

Semiconductor devices are manufactured by sequentially depositing a variety of material layers on a substrate (wafer) and patterning (etching) the material in accordance with a preselected layout pattern. The patterning step involves photolithography and etching, which are collectively referred to as just photolithography. Referring to FIG. 1, the photolithography sequence typically is as follows: a photoresist layer (not shown) is deposited on a predetermined material layer (not shown), and a photo mask having opaque patterns 12, which block light transmission on a transparent substrate 10, is placed over the photoresist layer. When light of a selected wavelength 14 is applied to the photo mask, the mask patterns are transferred onto the photoresist layer, forming exposed portions and shielded portions in the photoresist layer. Once exposed, the photoresist layer is developed in a solution that selectively dissolves the exposed portions or shielded portions to create a photoresist pattern. The photoresist pattern is typically used as an etching mask to etch the underlying material film, resulting in a transfer of the photoresist pattern to the material film.

In the strict sense of the word, the term "photo mask" is termed a mask, which has a pattern substantially equal in size to that of the photoresist pattern formed by exposure. Meanwhile, a photo mask for use in reduction projection exposure, which has a pattern several times larger than that in the photoresist layer formed by exposure, is termed a reticle. Hereinafter, the term "mask" will be used for any mask used in photolithography for the sake of convenience.

As the integration density of semiconductor devices continues to increase, linewidth of material layer patterns becomes narrow. Accordingly, it may become difficult to fabricate a desired pattern having a narrow linewidth using a conventional mask as shown in FIG. 1. If a mask having a fine linewidth is used, a sharp intensity difference of light, as shown in FIG. 1, at the boundary between opaque portions 18 and transmissive portions 16, is not ensured due to diffraction of light.

To avoid this problem, light having a short wavelength, for example, 248 nm or 193 nm, which barely causes diffraction, is used as an exposure light source. However, as linewidths become even finer, the use of the exposure light source having a short wavelength is no longer a satisfactory solution with respect to the problem of the unclear boundary between the opaque and transmissive portions. For this reason, a phase shift mask has been produced that causes destructive interference at the boundary between the transmissive portions 16 and the opaque portions 18 based on a light interference phenomenon.

The phase shift mask shown in FIG. 2, which is an attenuated (also referred to as half-tone) phase shift mask, includes a transparent substrate 20 and a phase shifter pattern 22 formed of a phase shifter material. The phase shifter material may be CrO, CrF, MoSiOn, SiN, or spin-on-glass (SOG). Although not shown, the phase shift mask is classified as a mask having a phase shifter pattern formed with SOG on or below opaque patterns, and a substrate-etch type mask in which the phase of light is varied by etching a transparent substrate to have a predetermined depth, instead of using a phase shifter material, to vary the transmission length of light.

The principle of a common phase shift mask will now be described with reference to FIG. 2. Light passed through transmissive portions 26 has a phase and amplitude as indicated by a dashed line 30 of the upper graph in FIG. 2. Light passed through phase shift portions 28 is phase shifted by 180° and has a phase and amplitude as indicated by a dashed line 32 of the same graph. Finally, light at the surface of the photoresist layer has a phase and amplitude as indicated by a solid line 34 of the same graph. Also, light intensity at the surface of the photoresist layer, which has passed through the transmissive portions 26 and the phase shifting portions 28, is as shown in the lower graph of FIG. 2. Compared with the upper graph in FIG. 1, light intensity difference at the boundary between the transmissive portions 26 and the phase shifting portions 28 of the phase shift mask in FIG. 2 is more distinct than that at the boundary between the transmissive portions 16 and the opaque portions 18 in FIG. 1.

However, as shown in the lower graph in FIG. 2 illustrating the light intensity, a secondary peak 36, which is called a "side-lobe", occurs in the phase shifting portions 28. The occurrence of the side-lobe 36 is inevitable as long as the phase shifter pattern 22 is not completely opaque. Also, when the size of the side-lobe is greater than a reference value, an undesired pattern may be formed in the developed photoresist pattern. For this reason, an opaque pattern may be employed on the center of the phase shifter pattern 22. However, it is difficult to apply this technique to a phase shifter pattern having a narrow width. Alternatively, a phase shifter material having a low transmissivity (for example, 5–10%) can be used for the purpose of reducing the side-lobe 36. However, the use of phase shifter material having the low transmissivity degrades the effect of the phase shift mask. As can be seen from the upper graph in FIG. 2, as the transmissivity of phase shifter material increases, the amplitude 32 of the light passed through the phase shifting portions 28 increases and the effect of destructive interference at the boundary between the transmissive portions 26 and the phase shifting portions 28 is enhanced, resulting in a more distinct boundary between the transmissive portions 26 and the phase shifting portions 28.

On the other hand, the problem with the side-lobe is closely associated with the performance of photoresist. In particular, when a photoresist layer is exposed to light having a higher intensity (energy) than a reference value, the exposed portions on the photoresist layer are dissolved and removed in a developer solution to afford photoresist patterns. However, when the performance of photoresist is so good (i.e., the reference value is considerably high) that it is not dissolved in a developer solution (i.e., when photoresist shows a higher contrast) even at a considerable side-lobe intensity, a phase shifter material having a higher transmissivity (for example, about 40%) can be used to enhance the efficiency of a phase shift mask. A need exists for a phase shift mask formed of a phase shifter material having a high transmissivity.

SUMMARY OF THE INVENTION

To meet the above need, it is a first object of the present invention to provide a phase shifter material having a relatively high transmissivity with respect to a short wavelength of exposure light.

A second object of the present invention is to provide a phase shifter material which shows transmissivity with respect to inspection light having a longer wavelength than exposure light, such that inspection with the inspection light is possible, and shows a higher transmissivity with respect to the exposure light.

A third object of the present invention is to provide a phase shift mask formed using the phase shifter material.

A fourth object of the present invention is to provide a method for manufacturing the phase shift mask.

The first and second objects may be achieved by a phase shifter material comprising chromium (Cr), aluminum (Al), oxygen (O) and nitrogen (N).

The third object may be achieved by a phase shift mask according to the present invention, which comprises: a transparent substrate and a phase shifting layer formed of a material including chromium (Cr), aluminum (Al), oxygen (O) and nitrogen (N) on the transparent substrate. The phase shifting layer is preferably semitransparent to a predetermined wavelength of exposure light.

The fourth object may be achieved by a method of manufacturing a phase shift mask comprising: preparing a transparent substrate; forming a phase shifting layer of a material including chromium (Cr), aluminum (Al), oxygen (O) and nitrogen (N) on the transparent substrate, the phase shifting layer being semitransparent to a predetermined wavelength of exposure light; and forming an opaque layer on the phase shifting layer, the opaque layer being opaque to the exposure light.

Preferably, the phase shifting layer, the CrAlON layer, is deposited on the transparent substrate in a sputtering chamber by sputtering, using a target formed of chromium (Cr) and aluminum (Al) alloy, or a multi-target separated into Cr and Al targets, and oxygen ($O_2$) and nitrogen ($N_2$) gases as reaction gases that are provided in the sputtering chamber.

Also, the phase shifting layer may be etched to have a predetermined phase shifter pattern for use in exposure by dry etching with chloride ($Cl_2$) and oxygen ($O_2$) gases.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

Figure 1:
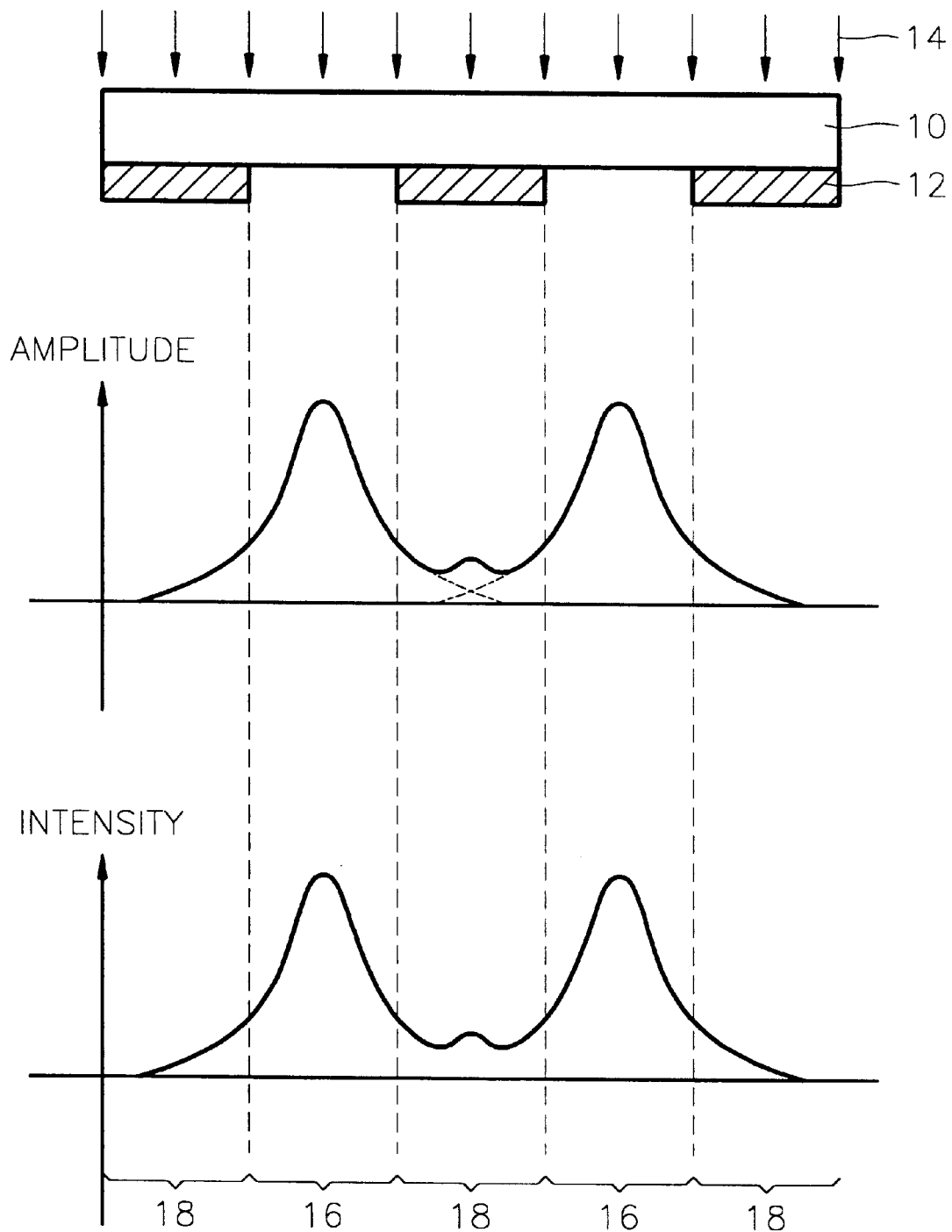
FIG. 1 depicts a sectional view of a known photo mask and graphs illustrating phase and intensity of light at the surface of a photoresist layer exposed using the photo mask.
Figure 2:
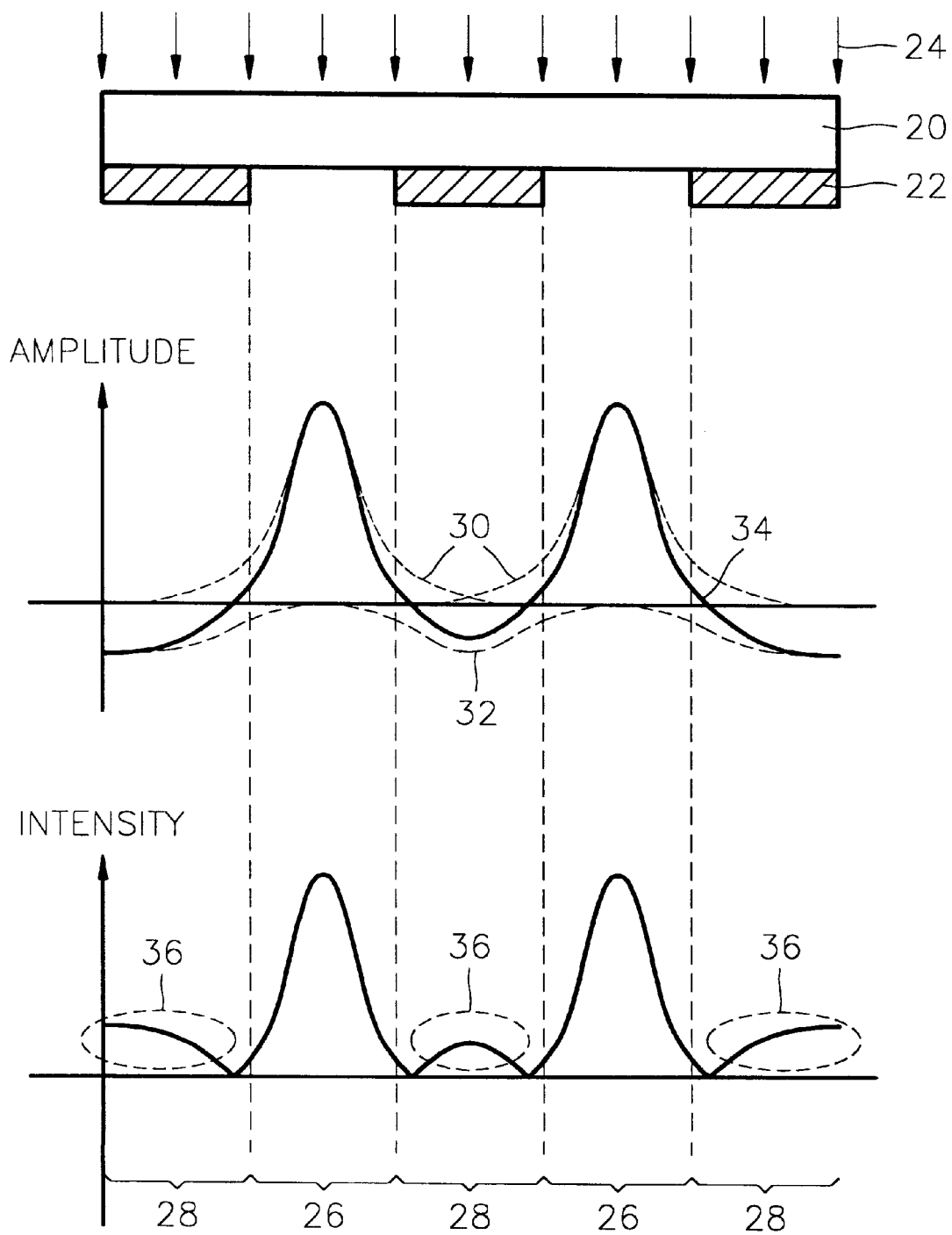
FIG. 2 depicts a sectional view of a general attenuated phase shift mask and graphs illustrating phase and intensity of light at the surface of a photoresist layer exposed using the phase shift mask.

The mechanism for determining the transmissivity of a phase shifter material will now be described.

The transmissivity of phase shifter material is associated with the composition of the phase shifter material and the wavelength of irradiated light. When the energy of irradiated light is much lower or higher than the energy band gap Eg of phase shifter material, i.e., the amount of energy required to excite electrons of the phase shifter material into another energy level, the irradiated light cannot excite electrons of the phase shifter material, but just transmits through the phase shifter material, increasing the transmissivity of the phase shifter material. However, when the energy of irradiated light is similar to or slightly higher than the energy band gap Eg of the phase shifter material, the energy of irradiated light is used in exciting electrons of the phase shifter material, i.e., the irradiated light is absorbed by the phase shifter material, thereby lowering the transmissivity of the light shifter material. In particular, in a shorter wavelength range, such as for example, wavelengths of 193 nm, 248 nm and 365 nm (which is what we are interested in), the higher the energy is of the exposure light and the closer to the energy band gap Eg of the phase shifter material. Thus, the shorter the wavelength of exposure light in the wavelength range, the lower the transmissivity of the phase shifter material. A conventional phase shifter material, which has a transmissivity of 1–30% with respect to the wavelength of 248 nm or 365 nm, transmits almost no light having a wavelength shorter than 248 nm (for example, 193 nm), thus acting as an opaque material. U.S. Pat. No. 5,851,706, which is assigned and incorporated herein by reference, teaches a phase shifter material having appropriate transmissivity with respect to a shorter wavelength of light and formed of chromium oxide ($Cr_2O_3$) and alumina ($Al_2O_3$) to have the composition of CrAlO. The disclosure of this patent is incorporated as a reference herein.

The high-transmissivity phase shifter material including CrAlO may include the following problems. Usually, after manufacture of a mask to have a predetermined pattern, the mask is exposed to a defect inspection. In the defect inspection, a predetermined wavelength of light is irradiated on one side of the mask and the intensity of light is detected by a detector placed at the opposite side of the mask, whereby it is determined whether the pattern formed in the mask is desirable. However, inspection apparatuses use a longer wavelength of light as an inspection light, than that of the exposure light in photolithography. With the use of a shorter wavelength of exposure light, the wavelength of light used in defect inspection becomes short. However, development of an inspection apparatus using a shorter wavelength of light is achieved in accordance with the wavelength used in photolithography, and it is difficult to readily purchase such an inspection apparatus due to its high cost.

Thus, the transmissivity of phase shifter patterns, which is determined by the wavelength of exposure light used in an exposure process, increases further with respect to inspection light. The inspection light usually has a longer wavelength than the exposure light, so that the difference between transmissivity in the transmissive portions with no patterns and transmissivity in the phase shifting portions, is not sufficient to inspect whether the patterns formed are desirable.

Figure 3:
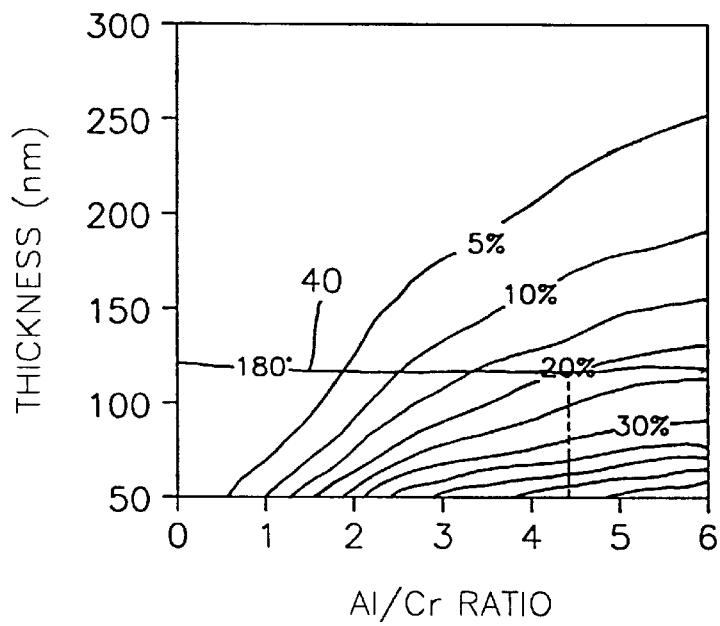
FIGS. 3 through 5 are graphs illustrating the transmissivity of a CrAlO layer with respect to light having a wavelength of 193 nm, 248 nm and 365 nm, respectively.
Figure 4:
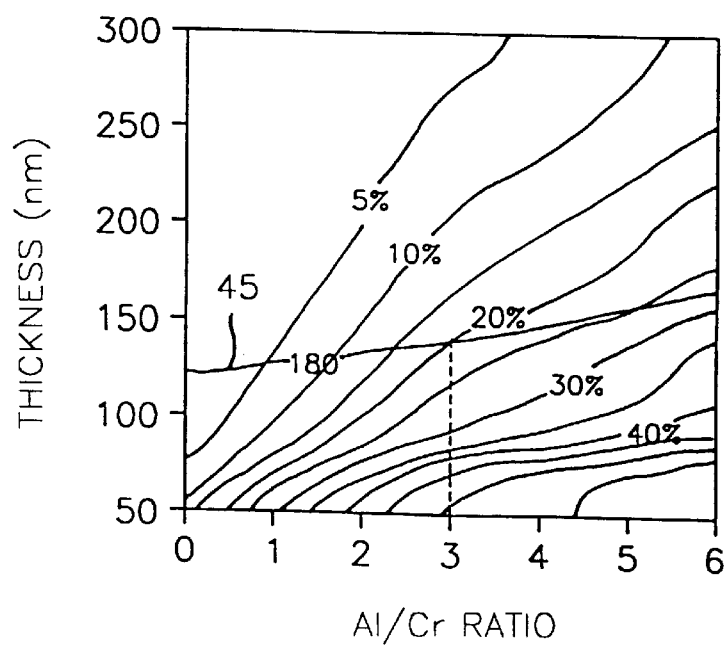
Figure 5:
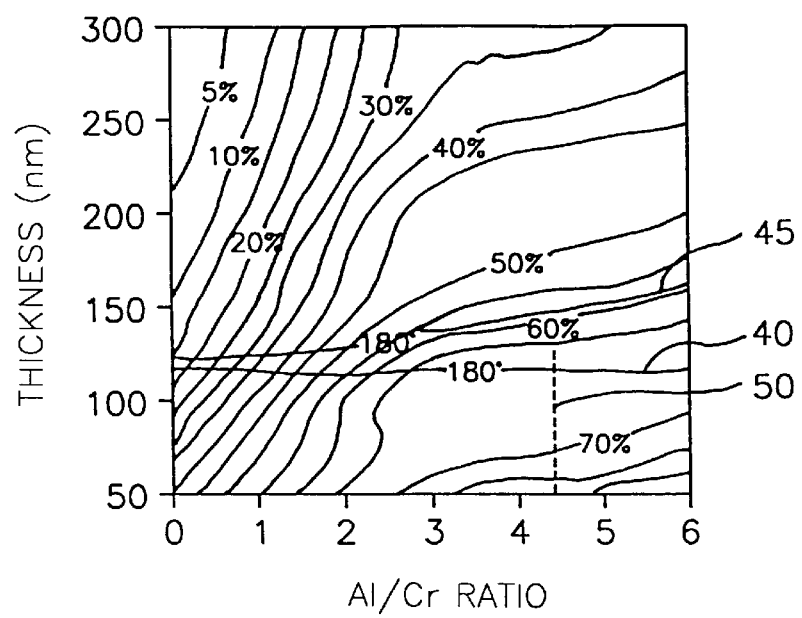

FIGS. 3 through 5 are graphs illustrating the transmissivity of a phase shifting layer formed of CrAlO with respect to light having a wavelength of 193 nm, 248 nm and 365 nm, respectively. In each graph, the X-axis represents the composition ratio of Al/Cr in the layer, the Y-axis represents the thickness of the CrAlO layer, and lines 40 and 45 indicate the thickness of the CrAlO layer for a phase shift of 180°.

As the Al content and the wavelength of exposure light increase, the transmissivity of the phase shifter layer increases. For example, for a phase shifting layer having a 20% transmissivity with respect to the 193-nm wavelength exposure light, the phase shifting layer has a thickness of about 124 nm with an Al/Cr ratio of about 4.5 for a phase shift of 180°. In this case, if a 365 nm wavelength of light is used as an inspection light source as shown in FIG. 5, the phase shifting layer shows transmissivity of 65% or more with respect to the inspection light, which can be read from the cross point between the phase shift line 40 and a line 50 indicating the Al/Cr ratio of 4.5, but does not permit accurate inspection of a mask formed thereof.

Figure 6:
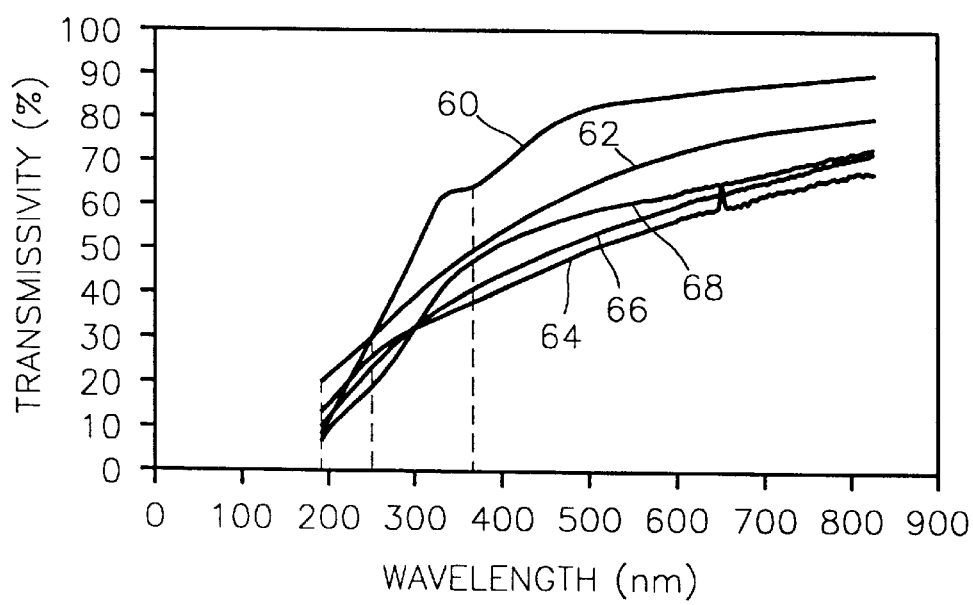
FIG. 6 is a graph illustrating the transmissivity of the CrAlO layer and a CrAlON layer according to the present invention with respect to the wavelength of irradiated light.

Thus, the requirements for phase shifter material are a high transmissivity with respect to a short wavelength of exposure light, without causing a sharp increase in transmissivity with respect to inspection light having a longer wavelength than the exposure light. In particular, embodiments of phase shifter material according to the present invention preferably satisfies the following conditions:

1. To have a transmissivity of about between 5 and about 50% with respect to exposure light
2. To shift the phase of exposure light by 180°.
3. To have a transmissivity of about 50% or less with respect to inspection light Briefly, it can be concluded that the phase shifter material according to the present invention, e.g., the CrAlON composition, meets the above criteria. The transmissivity of the CrAlO layer and CrAlON layer with respect to the wavelength of light irradiated is shown in FIG. 6. As shown in FIG. 6, the CrAlO layer 60 and CrAlON layers 62, 64, 66 and 68 have a transmissivity in the range of between about 5 to about 40% with respect to the 193-nm and 248-nm wavelength light. When 365-nm wavelength light is used for inspection light, the CrAlO layer 60 has a transmissivity of about 65%, which makes inspection of a mask formed thereof impossible, while the CrAlON layers 62, 64, 66 and 68 according to the present invention have a transmissivity of 50% or less. The composition and the thickness of the CrAlO layer 60 and the CrAlON layers 62, 64, 66 and 68 are shown in Table 1. The thickness of each layer was determined to have a similar transmissivity with respect to the same wavelength of light, and a variation of transmissivity with respect to the wavelength of light was observed for each layer.

TABLE 1

| Layers | Cr (atomic %) | Al (atomic %) | O (atomic %) | N (atomic %) | Thickness (Å) |
|---|---|---|---|---|---|
| CrAlO layer 60 | 15.6 | 20.1 | 64.3 | 0 | 738 |
| CrAlON layer 62 | 32.0 | 27.7 | 16.0 | 24.3 | 329 |
| CrAlON layer 64 | 61.1 | 0.2 | 17.0 | 21.0 | 380 |
| CrAlON layer 66 | 45.1 | 11.7 | 29.1 | 14.0 | 533 |
| CrAlON layer 68 | 25.7 | 15.9 | 32.0 | 26.4 | 701 |

It should be noticed from FIG. 6 that the slope of transmissivity with respect to the wavelength of light is alleviated by the addition of N. In other words, the increase in transmissivity of light at a higher wavelength becomes flatter for the CrAlON layers 62, 64, 66 and 68, compared with the CrAlO layer 60 containing no N. In addition, the higher the composition ratio of Al/(Cr+Al) the higher the transmissivity of light. As the result of several experiments, when the ratio of Al/(Cr+Al) is in the range of 0.5 to 0.9, a desirable phase shifter material having a higher transmissivity, which satisfies the above-mentioned criteria, can be obtained. It is to be noted that the atomic % of N in a preferred embodiment of the present invention is equal to or less than 50 atomic %.

Figure 7:
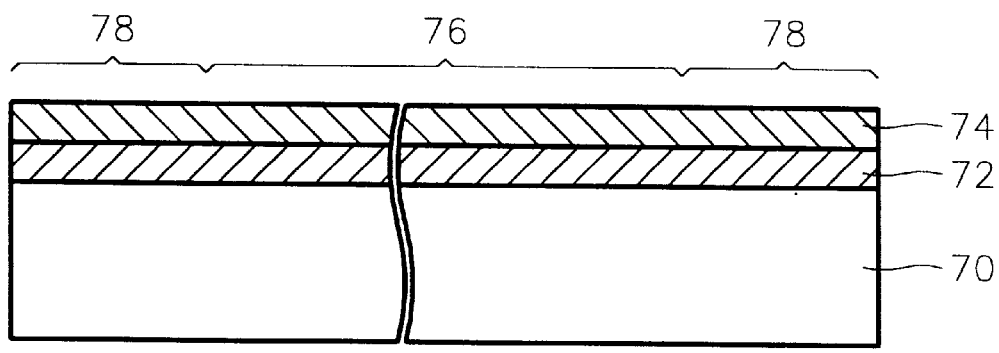
FIGS. 7 and 8 are sectional views illustrating phase shift mask manufacture according to the present invention.
Figure 8:
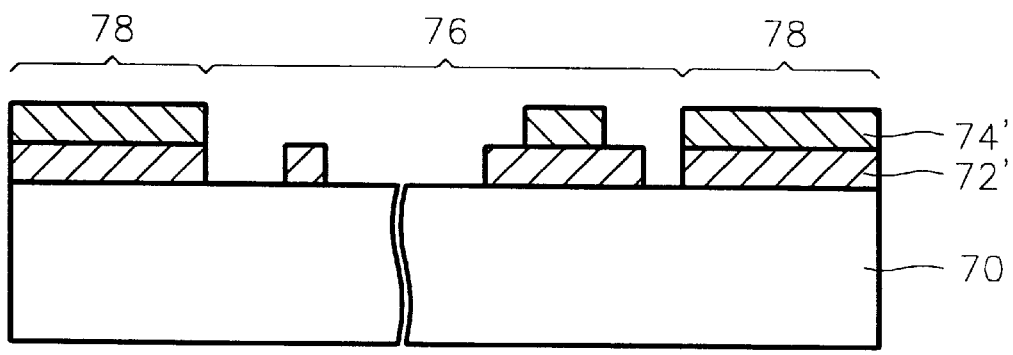

The phase shift mask and a method of manufacturing the same according to the present invention will now be described. FIG. 7 is a sectional view of a blank phase shift mask manufactured by the method according to the present invention. The blank mask refers to a mask having no patterns. During exposure, a mask having a desired pattern shown in FIG. 8, which is obtained by etching an opaque layer 74 and a phase shifting layer 72 at the central exposure portion 76 of the blank mask, is used. In FIGS. 7 and 8, a transparent substrate 70 is illustrated below the phase shifting layer 72 and the opaque layer 74 for the convenience of explanation, but during exposure with the mask according to the present invention the transparent substrate 70 is placed facing an exposure light source. Also, in general, an anti-reflection layer formed of a low reflectivity material such as chromium oxide may be formed on the opaque layer 74, but is regarded as being unrelated to the present invention, and thus not illustrated in FIGS. 7 and 8.

Referring back to FIG. 7, the phase shift mask according to the embodiment of the present invention has the phase shifting layer 72 formed of CrAlON and the opaque layer 74 formed of, for example, Cr, on the transparent substrate 70 formed of a transparent material such as glass. The transmissivity of the phase shifting layer with respect to the wavelength of light used for exposure, and the degree of phase shifting thereof vary according to the thickness of the phase shifting layer 72 and the composition ratio of CrAlON therein. In one embodiment, the thickness of the phase shifting layer 72 and the composition ratio of CrAlON therein can be varied to exhibit a transmissivity of 5–50% and the phase shift ratio of 180° with respect to the wavelength of exposure light used, as described in Table 1.

Referring to FIG. 8, the mask for use in exposure includes the exposure portion 76 having a desired phase shifter pattern 72' from which the opaque layer 74 has been removed, and a peripheral region 78 in which an identification number (ID) of the mask is noticed and keys for alignment used for installation to an exposure or inspection apparatus are arranged. In attenuated phase shift masks, generally the exposure portion 76 has only the phase shifter pattern 72' without the opaque layer 74. However, to prevent the previously mentioned side-lobe, an opaque pattern 74' may remain at the center of the phase shifter pattern 72', which has a relatively wider width than in other phase shifter patterns.

The method of manufacturing the phase shift mask according to one embodiment of the present invention will now be described.

The manufacture of the blank phase shift mask shown in FIG. 7 will now be described. In the manufacture of the blank phase shift mask, a sputtering method is adopted, but other methods such as chemical vapor deposition (CVD) can be used.

Figure 9:
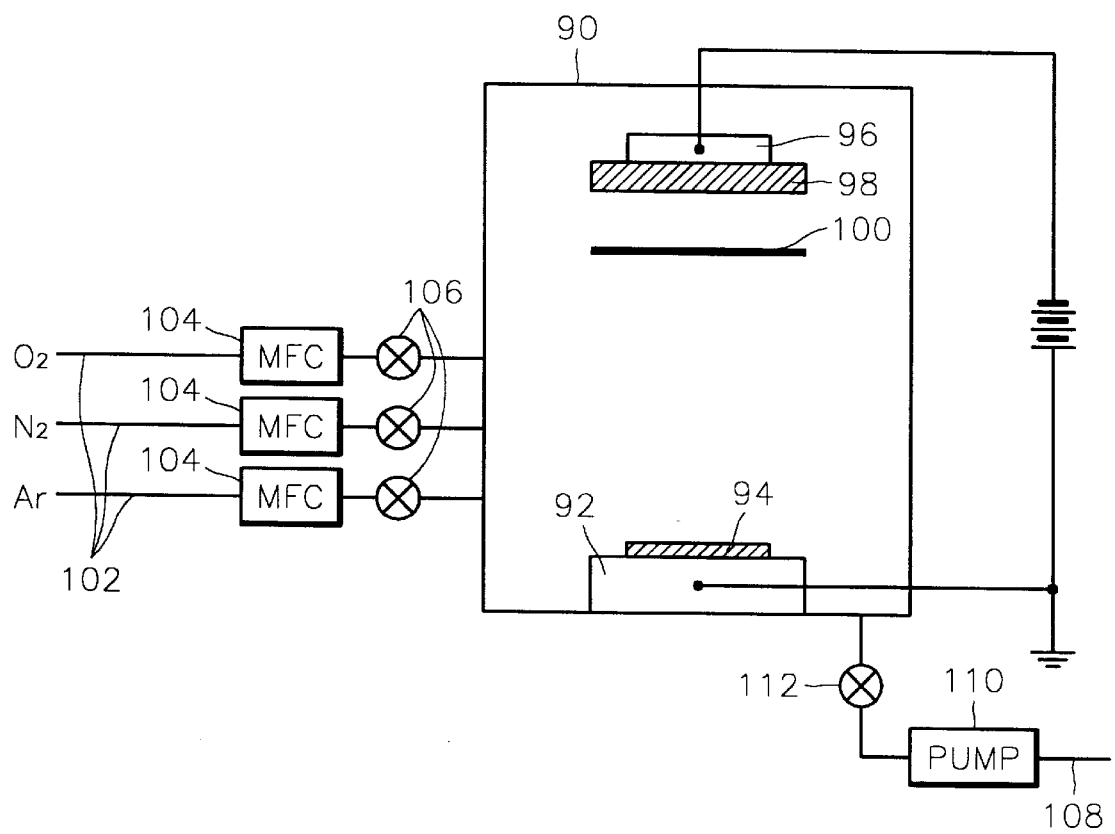
FIG. 9 schematically shows a sputtering apparatus for use in the manufacture of a phase shift mask according to the present invention.

A sputtering apparatus shown in FIG. 9, which is used in the manufacture of the blank phase shift mask, includes a chamber 90, gas inlets 102 via which reaction gases are supplied into the chamber 90, a pump 110 for controlling the pressure of the chamber 90, and an exhaust outlet 108. Also, mass flow controllers 104 and control valves 106 are attached to corresponding gas inlets 102, to control the mass flow and the supply or cutting-off of gases. A control valve 112 is also attached to the exhaust outlet 108. A support 92 for supporting a mask substrate 94 is installed in the chamber 90, and the positive electrode of a DC power supply is connected to the support 92. Also, a target 98 made of a material to be coated on the substrate 94, is installed facing the substrate 94 and connected to the negative electrode 96. The target 98 may be a target formed of an Al and Cr alloy, or a multi-target separated into Al and Cr targets. A shutter 100 for blocking of the passage of the target material separated from the target 98 toward the substrate 94 is disposed below the target 98. Although not shown, a magnet may be placed on the target 98 to apply a magnetic field to sputter gas ions or target material ions. Also, although only one pump 110 is illustrated in FIG. 9, the sputtering apparatus may further include a turbo pump which quickly brings the chamber into high vacuum conditions.

In the manufacture of the blank phase shift mask according to the present invention using the sputtering apparatus shown in FIG. 9, the transparent substrate 94 formed of glass or quartz is put on the support 92, and the pump 110 is operated to exhaust the chamber 90 until the pressure of the chamber reaches $1 \times 10^{-6}$ to $6 \times 10^{-6}$ Torr, to remove impurities from the chamber 90. When the removal of impurities is sufficient, DC power of about 60W is applied to the support 92 and the electrode 96. In turn, oxygen ($O_2$) and nitrogen ($N_2$), which are reaction gases, and argon ions ($Ar^+$), which is a sputtering gas, are supplied into the chamber 90, wherein the mass flow of the gases is controlled by using the mass flow controllers 104 and the control valves 106 attached to the gas inlets 102. At this time, the shutter 100 is in a closed state. The pressure of the chamber 90 is maintained at $5 \times 10^{-33}$ Torr, and the temperature of the substrate 94 is adjusted to room temperature.

After a predetermined period of time in the state where the shutter 100 is closed, argon ions start to sputter the target 98. As a result, impurities are removed from the surface of the target 98, and sputter yield reaches an equilibrium, wherein the same amount of Cr and Al fall down from the target 98 as the amount of Cr and Al in the target 98. When the shutter 100 is opened, the separated target materials, as well as oxygen and nitrogen are deposited on the transparent substrate 94, forming a CrAlON layer thereon.

Here, the composition ratio of the CrAlON layer deposited on the transparent substrate 94 is defined by the ratio of Cr and Al in the target 98 and the flow rate of $O_2$ and $N_2$, which are used as reaction gases. According to a desired composition of the CrAlON layer, a target which has a Cr and Al composition corresponding to the desired composition ratio is selected for use, and the flow rate of $O_2$ and $N_2$ is adjusted to a value in the range of 0 to 20 sccm. Also, the flow rate of Ar gas used as a sputtering gas is adjusted to a value in the range of 7 to 30 sccm. Also, in the case of using multi-targets, the areas of the Al and Cr targets can be controlled such that Cr and Al are separated from each target in a desired ratio, taking into account the sputter yield of Cr and Al.

Sputtering is continued preferably until the CrAlON layer as a phase shifting layer has a thickness which is thick enough to shift the phase of the exposure light source to 180°. When the CrAlON layer reaches the required thickness, the sputtering is stopped.

Then, to form the opaque layer 74 (see FIG. 7) and the anti-reflection layer, sputtering is performed again with a different target (or in another sputtering apparatus with a different target) for a predetermined period of time.

Hereinafter, the method of manufacturing a phase shift mask having patterns, which is used in exposure, will now be described. The phase shift mask shown in FIG. 8 is obtained by etching the exposure portion 76 of the blank phase shift mask, which is manufactured by the above described processes, to have a predetermined pattern.

First, the anti-reflection layer and the opaque layer 74 are removed from the exposure portion 76 of the blank mask shown in FIG. 7. To avoid occurrence of side-lobe, part of the opaque layer may remain.

Then, etching for phase shifter patterns is carried out. In the present embodiment, the etching of the CrAlON layer as a phase shifting layer is performed by reactive ion etching (RIE) which is a kind of plasma etching.

For etching of the phase shifting layer, the entire surface of the mask from which the opaque layer has been completely or partially removed is coated with electron beam resist and then exposed to electron beam radiation to write a desired pattern on the mask. The portions of the mask exposed to electron beam irradiation are removed by developing, resulting in an electron beam resist pattern. The CrAlON layer is etched by using the electron beam resist pattern as an etching mask to expose the transparent substrate 70. The electron beam resist pattern used is then removed, so that a photo mask having a desired phase shifter pattern thereon is obtained. The phase shifter pattern is then used for exposure.

In one illustrative embodiment, the etching of the CrAlON layer was carried out under the following etching conditions by using chloride ($Cl_2$) and oxygen ($O_2$) gases as etching gases.

Flow rate of $Cl_2$: 35 sccm
Flow rate of $O_2$: 10 sccm
Temperature of substrate: room temperature
Pressure of etching chamber: 6 mTorr
Power for RIE: 15 W
Power for inductively coupled plasma (ICP): 600 W It took about 15 minutes to etch the CrAlON layer having a thickness of 588 Å under the above conditions.

Also, it was ascertained that the phase shifter material, i.e., CrAlON, according to the present invention has a relatively high transmissivity with respect to exposure light, and when the phase shifter material has a predetermined thickness, it shifts the phase of exposure light used by 180°. In addition, the phase shifter material according to the present invention has a transmissivity of 50% or less with respect to inspection light which has a longer wavelength than the wavelength of the exposure light. Thus, the CrAlON composition according to the present invention can be used as a phase shifter material having a relatively high transmissivity with respect to a short wavelength of exposure light, which ensures high resolution. Also, the CrAlON composition according to the present invention shows a relatively low transmissivity with respect to a longer wavelength of inspection light, so that inspection of the mask formed of CrAlON can be accurately carried out.

Although the preferred embodiment is described with reference to a specific type of deposition and etching apparatus, it is to be appreciated that the scope of the present invention is not limited to the embodiments set forth above. Also, the processing conditions may be varied depending on the deposition or etching apparatus used.

What is claimed is:
1. A phase shift mask comprising:
   a transparent substrate; and,
   a phase shifting layer formed of a material including chromium (Cr), aluminum (Al), oxygen (O) and nitro- gen (N) on the transparent substrate, the phase shifting layer being semitransparent to a predetermined wavelength of exposure light.

2. The phase shift mask of claim 1, further comprising an opaque layer formed on the phase shifting layer.

3. The phase shift mask of claim 1, wherein the phase shifting layer has a thickness such that transmitted light through the phase shifting layer is shifted by about 180 degrees.

4. The phase shift mask of claim 1, wherein the phase shifting layer includes nitrogen in concentrations equal to or less than 50 atomic %.

5. The phase shift mask of claim 1, wherein the phase shifting layer includes a ratio of Al/(Cr+Al) between about 0.5 and 0.9.

6. The phase shift mask of claim 1, wherein the phase shifting layer has a thickness such that the transmissivity of the phase shifting layer is between about 5% to about 50% with respect to the exposure light.

7. The phase shift mask of claim 1, wherein the phase shifting layer has a thickness such that the transmissivity of the phase shifting layer is 50% or less with respect to an inspection light.

8. A phase shift mask, comprising:

a transparent substrate;

a phase shifting layer formed of a material including chromium (Cr), aluminum (Al), oxygen (O) and nitrogen (N) on the transparent substrate, the phase shifting layer being semitransparent to a predetermined wavelength of exposure light; and, the phase shifting layer including a plurality of patterned elements employed for masking light.

9. The phase shift mask of claim 8, further comprising an opaque layer formed on the patterned elements.

10. The phase shift mask of claim 9, wherein the patterned elements have a thickness such that transmitted light through the patterned elements is shifted by about 180 degrees.

11. The phase shift mask of claim 8, wherein the phase shifting layer includes nitrogen in concentrations equal to or less than 50 atomic %.

12. The phase shift mask of claim 8, wherein the phase shifting layer includes a ratio of Al/(Cr+Al) of between about 0.5 and about 0.9.

13. The phase shift mask of claim 8, wherein the phase shifting layer has a thickness such that the transmissivity of the patterned elements is between about 5% to about 50% with respect to the exposure light.

14. The phase shift mask of claim 8, wherein the phase shifting layer has a thickness such that the transmissivity of the patterned elements is 50% or less with respect to an inspection light.

15. A method of manufacturing a phase shift mask comprising:

preparing a transparent substrate;

forming a phase shifting layer of a material including chromium (Cr), aluminum (Al), oxygen (O) and nitrogen (N) on the transparent substrate, the phase shifting layer being semitransparent to a predetermined wavelength of exposure light; and, forming an opaque layer on the phase shifting layer, the opaque layer being opaque to the exposure light.

16. The method of claim 15, wherein the phase shifting layer includes nitrogen in concentrations equal to or less than 50 atomic %.

17. The method of claim 15, wherein the phase shifting layer includes a ratio of Al/(Cr+Al) of between about 0.5 and about 0.9.

18. The method of claim 15, wherein the phase shifting layer is deposited on the transparent substrate in a sputtering chamber by sputtering, using a target formed of chromium (Cr) and aluminum (Al) alloy, and oxygen ($O_2$) and nitrogen ($N_2$) gases as reaction gases that are provided in the sputtering chamber.

19. The method of claim 15, wherein the phase shifting layer is deposited on the transparent substrate in a sputtering chamber by sputtering using a multi-target separated into Cr and Al targets, and oxygen ($O_2$) and nitrogen ($N_2$) gases as reaction gases that are provided in the sputtering chamber.

20. The method of claim 15, after the formation of the opaque layer, further comprising the steps of:

etching the opaque layer to have a predetermined pattern, or such that the entire region of the opaque layer, which has been exposed to exposure light during photolithography, is removed; and, etching the phase shifting layer to have a predetermined pattern.

21. The method of claim 20, wherein the etching of the phase shifting layer into a predetermined pattern comprises the steps of:

depositing electron beam resist on the entire surface of the phase shift mask from which the opaque layer has been etched;

irradiating an electron beam to write a predetermined pattern on the electron beam resist, and developing the electron beam resist to form an electron beam resist pattern; and, etching the phase shifting layer using the electron beam resist pattern as an etching mask.

22. The method of claim 20, wherein the phase shifting layer is dry etched using chloride ($Cl_2$) and oxygen ($O_2$) gases.

* * * * *